(12) United States Patent
Kashiwagi et al.

(10) Patent No.: US 8,765,264 B2
(45) Date of Patent: *Jul. 1, 2014

(54) SILICONE LAMINATED SUBSTRATE, METHOD OF PRODUCING SAME, SILICONE RESIN COMPOSITION FOR PRODUCING SILICONE LAMINATED SUBSTRATE, AND LED DEVICE

(75) Inventors: Tsutomu Kashiwagi, Annaka (JP); Toshio Shiobara, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 770 days.

This patent is subject to a terminal disclaimer.

(21) Appl. No.: 12/557,209

(22) Filed: Sep. 10, 2009

(65) Prior Publication Data

US 2010/0065880 A1    Mar. 18, 2010

(30) Foreign Application Priority Data

Sep. 11, 2008   (JP) ................................. 2008-233102
Sep. 11, 2008   (JP) ................................. 2008-233103

(51) Int. Cl.
*C08K 3/22*     (2006.01)
*C08L 83/06*    (2006.01)
*B32B 27/28*    (2006.01)
*B32B 17/04*    (2006.01)
*H01L 23/14*    (2006.01)

(52) U.S. Cl.
CPC . *C08K 3/22* (2013.01); *C08L 83/06* (2013.01); *B32B 27/283* (2013.01); *B32B 17/04* (2013.01)
USPC ............... 428/447; 428/429; 528/15; 528/31; 528/32; 524/430

(58) Field of Classification Search
USPC ................ 428/447, 429; 528/15, 31; 525/478
IPC ....................................................... H01L 23/14
See application file for complete search history.

(56) References Cited

U.S. PATENT DOCUMENTS 4,025,485 A    5/1977    Kodama et al.
6,074,963 A    6/2000    Okami et al.
(Continued)

FOREIGN PATENT DOCUMENTS

EP    1 873 211    1/2008
JP    5-51873 A    3/1993
(Continued)

OTHER PUBLICATIONS

Office Action dated Apr. 29, 2011, in corresponding European Patent Application No. 09011621.1.

(Continued)

Primary Examiner — Brieann R Fink
(74) Attorney, Agent, or Firm — Birch, Stewart, Kolasch & Birch, LLP

(57) ABSTRACT

Silicone-laminated substrate, including glass cloth, and cured product of silicone resin composition—with which the glass cloth is filled and a surface of the glass cloth is coated. The silicone resin composition includes: (A) an organopolysiloxane having a resin structure of specific siloxane units, (B) an organohydrogenpolysiloxane having a resin structure of specific siloxane units, (C) a platinum group metal-based catalyst, and (D) a filler. The silicone-laminated substrate exhibits excellent mechanical properties, flexibility and workability, has minimal surface tack, and is easy to handle. The silicone-laminated substrate is produced by impregnating a glass cloth with the silicone resin composition dissolved or dispersed in a solvent, subsequently evaporating the solvent from the glass cloth, and subjecting the composition impregnated into the glass cloth to heat-curing under compression-molding conditions. Also, an LED device which includes the silicone-laminated substrate and an LED chip mounted on top of the substrate.

20 Claims, 1 Drawing Sheet

(56) References Cited

U.S. PATENT DOCUMENTS

| | | | |
|---|---|---|---|
| 6,376,603 B1* | 4/2002 | Kashiwagi | 524/847 |
| 7,153,914 B2* | 12/2006 | Staiger et al. | 525/478 |
| 7,253,448 B2* | 8/2007 | Roberts et al. | 257/99 |
| 7,371,462 B2* | 5/2008 | Tsumura et al. | 428/447 |
| 7,785,715 B2* | 8/2010 | Tsumura et al. | 428/447 |
| 2005/0137328 A1 | 6/2005 | Staiger et al. | |
| 2007/0013049 A1 | 1/2007 | Asai et al. | |
| 2007/0129508 A1* | 6/2007 | Kashiwagi | 525/478 |
| 2011/0092647 A1 | 4/2011 | Morita et al. | |

FOREIGN PATENT DOCUMENTS

| | | |
|---|---|---|
| JP | 6-155517 A | 6/1994 |
| JP | 7-266356 A | 10/1995 |
| JP | 2000-265073 A | 9/2000 |
| JP | 2001-13513 | 1/2001 |
| JP | 2001-207059 A | 7/2001 |
| JP | 2005-63693 A | 3/2005 |
| JP | 2005-179681 A | 7/2005 |
| JP | 2007-182549 A | 7/2007 |
| JP | 2008-13713 A | 1/2008 |
| JP | 2009-242627 A | 10/2009 |

OTHER PUBLICATIONS

Japanese Office Action for corresponding Application No. 2009-200005 dated Nov. 5, 2012 (with English translation).

Chinese Office Action, dated Nov. 27, 2012, for Chinese Application No. 200910173727.9.

Decision of Refusal dated Jul. 30, 2013 of Japanese Application No. 2009-200005 with English translation.

Second Notification of Examiner's Opinion dated Sep. 2, 2013 for Chinese Application No. 200910173727.9 with partial English translation.

* cited by examiner

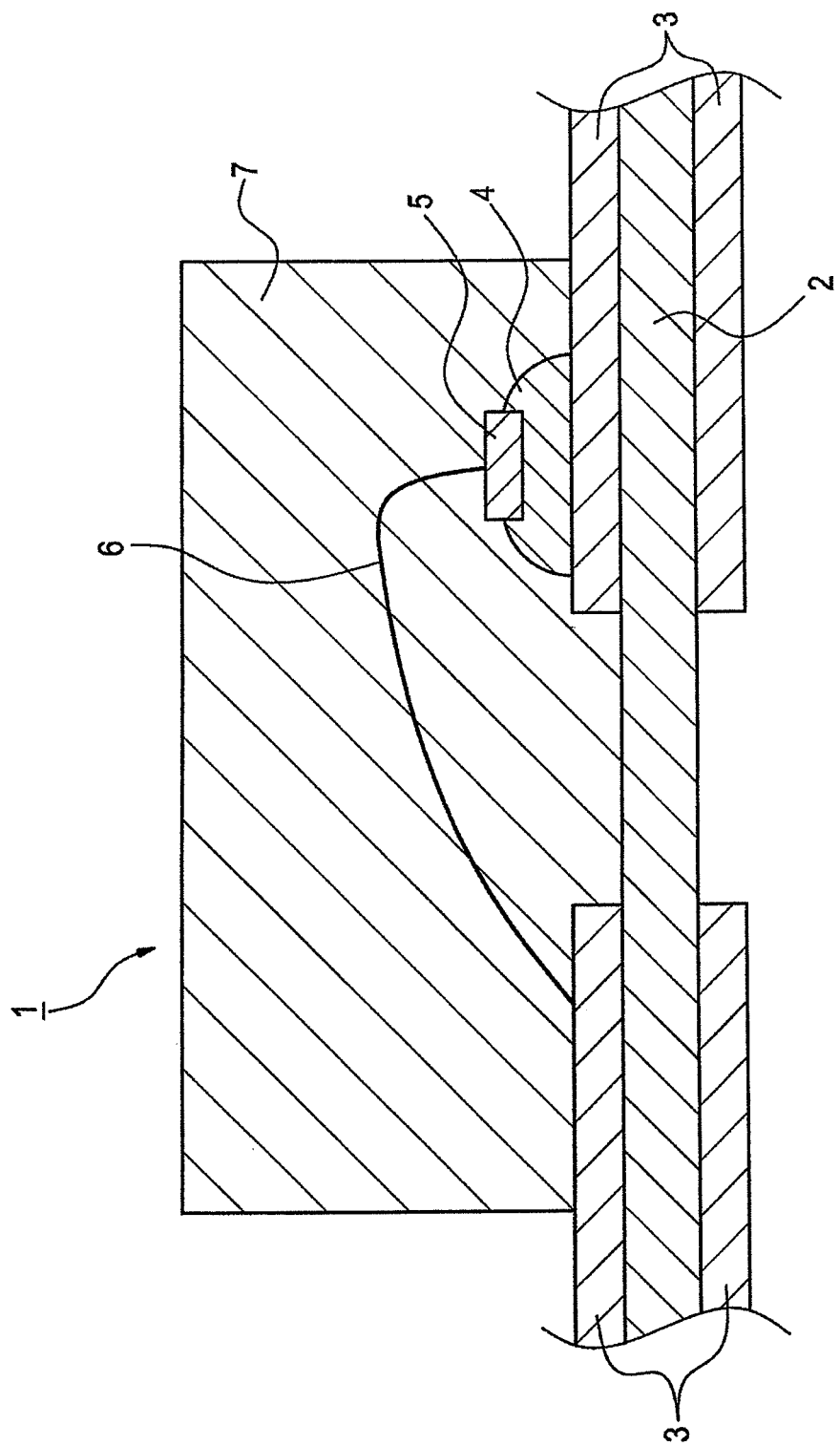

SILICONE LAMINATED SUBSTRATE, METHOD OF PRODUCING SAME, SILICONE RESIN COMPOSITION FOR PRODUCING SILICONE LAMINATED SUBSTRATE, AND LED DEVICE

BACKGROUND OF THE INVENTION

1. Field of the Invention

The present invention relates to a silicone laminated substrate, a method of producing such a substrate, a silicone resin composition for producing the silicone laminated substrate, and an LED (light emitting diode) device. Examples of the silicone laminated substrate include silicone laminated substrates used for LED devices, and silicone laminated substrates for mounting electrical or electronic components or the like.

2. Description of the Prior Art

Substrates prepared by impregnating glass with an epoxy resin are widely used as LED mounting substrates and mounting substrates for electrical or electronic components or the like. However, demands for a shift to lead-free substrates, and substrate degradation caused by heat or light emitted from components remain problems for these types of substrates. Further, in the case of LED mounting substrates, which require superior heat resistance, ceramics such as alumina and aluminum nitride have been used. However, these substrates are not only expensive, but fabricating large-scale substrates tends to be problematic. Accordingly, silicone laminated substrates, which exhibit excellent properties such as weather resistance and heat resistance, and are widely used in all manner of applications, are now being investigated for use as LED mounting substrates and mounting substrates for electrical or electronic components or the like. However, because conventional silicone laminated substrates are produced using a condensation-curable varnish or addition-curable varnish, the production method tends to be complex, and the adhesive strength tends to be too weak to allow copper foil or the like to be bonded to the substrate surface.

Furthermore, in order to enable a silicone laminated substrate to be used as an LED mounting substrate or a mounting substrate for electrical or electronic components or the like, the silicone laminated substrate must also exhibit excellent crack resistance and shock resistance. Moreover, the silicone resin composition used in producing the silicone laminated substrate must be able to be cured within conventional molding apparatus, and is preferably a solid or semisolid at room temperature.

An example of the conventional technology relating to the present invention is disclosed within the patent publication listed below.

[Patent Document 1] US 2007/0013049 A1
[Patent Document 2] JP 2000-265073 A

SUMMARY OF THE INVENTION

Generally, in those cases where an addition-curable silicone varnish laminated substrate composition is used, the composition is B-staged during a precuring step, and the final laminated substrate is then produced using a hot press machine. However, the production steps are complex, and satisfactory levels of strength and workability are not always obtainable.

The present invention has an object of providing a silicone laminated substrate, such as a silicone laminated substrate used for an LED device, that exhibits excellent mechanical properties, flexibility and workability, has minimal surface tack, and is easy to handle, as well as a method of producing such a silicone laminated substrate, a silicone resin composition for producing such a silicone laminated substrate, and an LED device.

As a result of conducting intensive investigation aimed at achieving the above object, the inventors of the present invention discovered that a silicone laminated substrate, including a silicone laminated substrate used for an LED device, a method of producing such a silicone laminated substrate, a silicone resin composition for producing such a silicone laminated substrate, and an LED device described below were able to satisfy the above object, and the inventors were therefore able to complete the present invention.

In other words, a first aspect of the present invention provides a silicone laminated substrate, comprising:

a glass cloth, and a cured product of a silicone resin composition with which the glass cloth is filled and a surface of the glass cloth is coated, wherein the silicone resin composition comprises:

(A) an organopolysiloxane having a resin structure, consisting of $R^1SiO_{1.5}$ units, $R^2{}_2SiO$ units and $R^3{}_aR^4{}_bSiO_{(4-a-b)/2}$ units, wherein, $R^1$, $R^2$ and $R^3$ each independently represents a hydroxyl group, methyl group, ethyl group, propyl group, cyclohexyl group or phenyl group, each $R^4$ independently represents a vinyl group or allyl group, a represents 0, 1 or 2, and b represents 1 or 2, provided that a+b is 2 or 3, and including a structure in which at least a portion of the $R^2{}_2SiO$ units are connected in a continuous repeating sequence, and a number of units in the repeating sequence is within a range from 5 to 50, (B) an organohydrogenpolysiloxane having a resin structure, consisting of $R^1SiO_{1.5}$ units, $R^2{}_2SiO$ units and $R^3{}_cH_dSiO_{(4-c-d)/2}$ units, wherein, $R^1$, $R^2$ and $R^3$ are each independently as defined above, c represents 0, 1 or 2, and d represents 1 or 2, provided that c+d is 2 or 3, and including a structure in which at least a portion of the $R^2{}_2SiO$ units are connected in a continuous repeating sequence, and a number of units in the repeating sequence is within a range from 5 to 50:

in sufficient amount that a molar ratio of hydrogen atoms bonded to silicon atoms within component (B) relative to a combined total of vinyl groups and allyl groups within component (A) is within a range from 0.1 to 4.0, (C) a platinum group metal-based catalyst: in an effective amount, and (D) a filler: in an amount of not more than 900 parts by mass per 100 parts by mass of a combined total of components (A) and (B).

In one embodiment of the present invention, the silicone laminated substrate described above is a silicone laminated substrate used for an LED device, wherein the filler of component (D) comprises:

(D1) an inorganic filler other than component (D2): in an amount of not more than 600 parts by mass per 100 parts by mass of the combined total of components (A) and (B), and optionally when the silicone laminated substrate is required to be capable of reflecting light, (D2) a white pigment: in an amount within a range from 1 to 300 parts by mass per 100 parts by mass of the combined total of components (A) and (B).

A second aspect of the present invention provides a method of producing the above silicone laminated substrate, the method comprising:

impregnating a glass cloth with a silicone resin composition comprising the above components (A) to (D), wherein the silicone resin composition is dissolved or dispersed in a solvent, subsequently removing the solvent from the glass cloth by evaporation, and subsequently subjecting the silicone resin composition impregnated into the glass cloth to heat curing under compression molding conditions.

A third aspect of the present invention provides a silicone resin composition for producing a silicone laminated substrate, the composition comprising the above components (A) to (D).

A fourth aspect of the present invention provides an LED device comprising:

the above silicone laminated substrate used for an LED device, and an LED chip mounted on top of the substrate.

By employing the present invention, a silicone laminated substrate that exhibits excellent mechanical properties and minimal surface tack when compared with conventional silicone substrates can be obtained with comparative ease by using the addition-curable silicone resin composition of the present invention, which is readily moldable even in conventional molding devices. Further, in one embodiment of the present invention, a silicone laminated substrate used for an LED device can be easily obtained that exhibits excellent mechanical properties, heat resistance and discoloration resistance, as well as minimal surface tack. The silicone laminated substrate of the present invention, which includes the silicone laminated substrate used for an LED device according to the present invention, is prepared by filling a glass cloth with a hard silicone cured product, and although the cured product coats the surface of the glass cloth, the substrate exhibits excellent flexibility and is easy to handle. In particular, in those cases where a silicone resin composition that is solid at room temperature is used, the silicone resin composition that has been dissolved or dispersed in a solvent is impregnated into the glass cloth, and following removal of the solvent from the glass cloth by evaporation, the composition exists in a A-stage solid state, which offers the advantages of facilitating storage of the composition-impregnated glass cloth, simplifying the process of molding the glass cloth in a hot press machine, and enabling the silicone laminated substrate to be more freely molded into a desired shape. The silicone laminated substrate of the present invention exhibits excellent workability, and can be used favorably as a mounting substrate for all manner of electrical or electronic components, including the various semiconductor elements. The silicone laminated substrate used for an LED device according to the present invention exhibits excellent workability, and can be used favorably as a mounting substrate for an LED device. Furthermore, an LED device of the present invention, which is fabricated using the silicone laminated substrate used for an LED device according to the present invention, suffers minimal variation in emission wavelength (coloring) over time, and has a long lifespan.

BRIEF DESCRIPTION OF THE DRAWING

FIG. 1 is a cross-sectional view illustrating one example of an LED device of the present invention.

DETAILED DESCRIPTION OF THE PREFERRED EMBODIMENTS

A more detailed description of the present invention is presented below. When used herein, the term "room temperature" describes a temperature from 15 to 30° C. Further, when used herein, Ph represents a phenyl group, Me represents a methyl group, Et represents an ethyl group, and Vi represents a vinyl group.

[Silicone Resin Composition]

A silicone resin composition of the present invention comprises the components (A) to (D) described below, and is preferably used for producing a silicone laminated substrate of the present invention. A silicone resin composition of the present invention that comprises the components (A) to (C), (D1) and optionally (D2) described below is preferably used for producing a silicone laminated substrate used for an LED device according to the present invention. The composition of the present invention is preferably a solid at room temperature and is more preferably a plastic solid at room temperature. Compositions that are solid at room temperature are easy to handle, and need not be partially cured to facilitate handling, as is the case with conventional silicone resins.

A description of each of the components contained within the silicone resin composition of the present invention is presented below.

—(A) Organopolysiloxane having Resin Structure—

The component (A), which represents one of the important structural components of the composition of the present invention, is an organopolysiloxane having a resin structure (namely, a three dimensional network-type structure), which consists of $R^1SiO_{1.5}$ units, $R^2{}_2SiO$ units and $R^3{}_aR^4{}_bSiO_{(4-a-b)/2}$ units (wherein, $R^1$, $R^2$ and $R^3$ each independently represents a hydroxyl group, methyl group, ethyl group, propyl group, cyclohexyl group or phenyl group, each $R^4$ independently represents a vinyl group or allyl group, a represents 0, 1 or 2, and b represents 1 or 2, provided that a+b is 2 or 3), and partially includes a structure in which at least a portion of the $R^2{}_2SiO$ units are connected in a continuous repeating sequence, wherein the number of units in the repeating sequence is within a range from 5 to 50, preferably from 8 to 40, and more preferably from 10 to 35.

The structure in which at least a portion of the $R^2{}_2SiO$ units are connected in a continuous repeating sequence, and in which the number of units in the repeating sequence is within a range from 5 to 50, refers to a linear diorganopolysiloxane continuous chain structure represented by a general formula (1) shown below.

(1)

(wherein m represents an integer of 5 to 50)

In the organopolysiloxane of the component (A), at least a portion of all the $R^2{}_2SiO$ units, and preferably 50 mol % or more (namely, 50 to 100 mol %), and more preferably 80 mol % or more (namely, 80 to 100 mol %), of the $R^2{}_2SiO$ units form a continuous chain structure represented by the general formula (1) within the organopolysiloxane molecule.

In a molecule of the component (A), the presence of the $R^2{}_2SiO$ units causes the polymer molecule to extend in a linear chain-type structure, whereas the $R^1SiO_{1.5}$ units cause branching of the polymer molecule, or the formation of a three dimensional network structure. The $R^4$ groups (which each independently represents a vinyl group or allyl group) within the $R^3{}_aR^4{}_bSiO_{(4-a-b)/2}$ units perform the role of curing the composition of the present invention by undergoing a hydrosilylation addition reaction with the hydrogen atoms bonded to silicon atoms (namely, SiH groups) of the $R^3{}_cH_dSiO_{(4-c-d)/2}$ units within the component (B) described below.

The molar ratio between the three essential siloxane units that constitute the component (A), namely the molar ratio of $R^1SiO_{1.5}$ units:$R^2{}_2SiO$ units:$R^3{}_aR^4{}_bSiO_{(4-a-b)/2}$ units is preferably within a range from 90 to 24:75 to 9:50 to 1, and is more preferably within a range from 70 to 28:70 to 20:10 to 2 (provided the total is 100), as such a ratio yields more favorable properties for the resulting cured product.

The weight average molecular weight of the component (A) determined by gel permeation chromatography (GPC) and referenced against polystyrene standards is preferably within a range from 3,000 to 1,000,000, and particularly preferably from 10,000 to 100,000, as this ensures that the polymer is a solid or semisolid, and provides favorable levels of workability and curability.

An organopolysiloxane having this type of resin structure can be synthesized by combining the compounds that act as the raw materials for each of the units, in amounts that enable the three siloxane units to be formed within the product polymer in the required molar ratio described above, and then conducting a cohydrolysis-condensation, for example, in the presence of an acid.

Examples of the raw materials for the $R^1SiO_{1.5}$ units include chlorosilanes such as $MeSiCl_3$, $EtSiCl_3$, $PhSiCl_3$, propyltrichlorosilane and cyclohexyltrichlorosilane, and the alkoxysilanes such as methoxysilanes that correspond with each of these chlorosilanes.

Examples of the raw material for the $R^2{}_2SiO$ units include the compounds shown below.

$ClMe_2SiO(Me_2SiO)_jSiMe_2Cl$,
$ClMe_2SiO(Me_2SiO)_k(PhMeSiO)_LSiMe_2Cl$,
$ClMe_2SiO(Me_2SiO)_k(Ph_2SiO)_LSiMe_2Cl$,
$(HO)Me_2SiO(Me_2SiO)_jSiMe_2(OH)$,
$(HO)Me_2SiO(Me_2SiO)_k(PhMeSiO)_LSiMe_2(OH)$,
$(HO)Me_2SiO(Me_2SiO)_k(Ph_2SiO)_LSiMe_2(OH)$,
$(MeO)Me_2SiO(Me_2SiO)_jSiMe_2(OMe)$,
$(MeO)Me_2SiO(Me_2SiO)_k(PhMeSiO)_LSiMe_2(OMe)$,
$(MeO)Me_2SiO(Me_2SiO)_k(Ph_2SiO)_LSiMe_2(OMe)$
(wherein j is an integer of 3 to 48 (average value), k is an integer of 0 to 47 (average value), and L is an integer of 1 to 48 (average value), provided that k+L is an integer of 3 to 48 (average value))

Furthermore, the $R^3{}_aR^4{}_bSiO_{(4-a-b)/2}$ units represent any combination of one or more siloxane units selected from amongst $R^3R^4SiO$ units, $R^3{}_2R^4SiO_{0.5}$ units, $R^4{}_2SiO$ units, and $R^3R^4{}_2SiO_{0.5}$ units. The raw materials for these units include chlorosilanes such as $Me_2ViSiCl$, $MeViSiCl_2$, $Ph_2ViSiCl$ and $PhViSiCl_2$, and alkoxysilanes such as methoxysilanes that correspond with each of these chlorosilanes.

In the present invention, during production of the organopolysiloxane of the component (A) by cohydrolysis and condensation of the raw material compounds described above, the $R^1SiO_{1.5}$ units, $R^2{}_2SiO$ units, $R^3{}_aR^4{}_bSiO_{(4-a-b)/2}$ units, or combination of two or more of these units may include siloxane units that contain a silanol group. The organopolysiloxane of the component (A) may typically comprise not more than 10 mol % (namely, from 0 to 10 mol %) of these silanol group-containing siloxane units relative to the combined total of all the siloxane units. Examples of the silanol group-containing siloxane units include $(HO)SiO_{1.5}$ units, $R^{2'}(HO)SiO$ units, $(HO)_2SiO$ units, $R^4(HO)SiO$ units, $R^4{}_2(HO)SiO_{0.5}$ units, $R^{3'}R^4(HO)SiO_{0.5}$ units, and $R^4(HO)_2SiO_{0.5}$ units (wherein $R^{2'}$ and $R^{3'}$ are as defined above for $R^2$ and $R^3$ respectively with the exception of excluding the hydroxyl group, and $R^4$ is as defined above). The hydroxyl group mentioned in relation to $R^1$, $R^2$ and $R^3$ represents the hydroxyl group within these silanol group-containing siloxane units described above.

—(B) Organohydrogenpolysiloxane having Resin Structure—

The component (B), which represents one of the important structural components of the composition of the present invention, is an organohydrogenpolysiloxane having a resin structure (namely, a three dimensional network-type structure), which consists of $R^1SiO_{1.5}$ units, $R^2{}_2SiO$ units and $R^3{}_cH_dSiO_{(4-c-d)/2}$ units (wherein, $R^1$, $R^2$ and $R^3$ are each independently as defined above, c represents 0, 1 or 2, and d represents 1 or 2, provided that c+d is 2 or 3), and partially includes a linear siloxane structure in which at least a portion of the $R^2{}_2SiO$ units are connected in a continuous repeating sequence, wherein the number of units in the repeating sequence is within a range from 5 to 50, is preferably from 8 to 40, and is more preferably from 10 to 35.

In a similar manner to that described for the component (A), the structure in which at least a portion of the $R^2{}_2SiO$ units are connected in a continuous repeating sequence, and in which the number of units in the repeating sequence is within a range from 5 to 50, describes a structure in which at least a portion of the $R^2{}_2SiO$ units, and preferably 50 mol % or more (namely, 50 to 100 mol %), and more preferably 80 mol % or more (namely, 80 to 100 mol %), of the $R^2{}_2SiO$ units within the component (B) form a linear diorganopolysiloxane continuous chain structure represented by the above general formula (1) within the molecule of the component (B).

In a molecule of the component (B), the presence of the $R^2{}_2SiO$ units causes the polymer molecule to extend in a linear chain-type structure, whereas the $R^1SiO_{1.5}$ units cause branching of the polymer molecule, or the formation of a three dimensional network structure. The hydrogen atoms bonded to silicon atoms within the $R^3{}_cH_dSiO_{(4-c-d)/2}$ units perform the role of curing the composition of the present invention by undergoing a hydrosilylation addition reaction with the alkenyl groups within the component (A).

The molar ratio between the three essential siloxane units that constitute the component (B), namely the molar ratio of $R^1SiO_{1.5}$ units:$R^2{}_2SiO$ units:$R^3{}_cH_dSiO_{(4-c-d)/2}$ units is preferably within a range from 90 to 24:75 to 9:50 to 1, and is more preferably within a range from 70 to 28:70 to 20:10 to 2 (provided the total is 100), as such a ratio yields more favorable properties for the resulting cured product.

The weight average molecular weight of the component (B) determined by GPC and referenced against polystyrene standards is preferably within a range from 3,000 to 1,000, 000, and particularly preferably from 10,000 to 100,000, as this provides more favorable levels of workability and curability.

An organohydrogenpolysiloxane having this type of resin structure can be synthesized by combining the compounds that act as the raw materials for each of the units, in amounts that enable the three siloxane units to be formed within the product polymer in the required molar ratio described above, and then conducting a cohydrolysis-condensation, for example, in the presence of an acid.

Examples of the raw materials for the $R^1SiO_{1.5}$ units include chlorosilanes such as $MeSiCl_3$, $EtSiCl_3$, $PhSiCl_3$, propyltrichlorosilane and cyclohexyltrichlorosilane, and the alkoxysilanes such as methoxysilanes that correspond with each of these chlorosilanes.

Examples of the raw material for the $R^2{}_2SiO$ units include the compounds shown below.

ClMe$_2$SiO(Me$_2$SiO)$_j$SiMe$_2$Cl,
ClMe$_2$SiO(Me$_2$SiO)$_k$(PhMeSiO)$_L$SiMe$_2$Cl,
ClMe$_2$SiO(Me$_2$SiO)$_k$(Ph$_2$SiO)$_L$SiMe$_2$Cl,
(HO)Me$_2$SiO(Me$_2$SiO)$_j$SiMe$_2$(OH),
(HO)Me$_2$SiO(Me$_2$SiO)$_k$(PhMeSiO)$_L$SiMe$_2$(OH),
(HO)Me$_2$SiO(Me$_2$SiO)$_k$(Ph$_2$SiO)$_L$SiMe$_2$(OH),
(MeO)Me$_2$SiO(Me$_2$SiO)$_j$SiMe$_2$(OMe),
(MeO)Me$_2$SiO(Me$_2$SiO)$_k$(PhMeSiO)$_L$SiMe$_2$(OMe),
(MeO)Me$_2$SiO(Me$_2$SiO)$_k$(Ph$_2$SiO)$_L$SiMe$_2$(OMe)
(wherein j is an integer of 3 to 48 (average value), k is an integer of 0 to 47 (average value), and L is an integer of 1 to 48 (average value), provided that k+L is an integer of 3 to 48 (average value))

Furthermore, the $R^3_cH_dSiO_{(4-c-d)/2}$ units represent any combination of one or more siloxane units selected from amongst $R^3HSiO$ units, $R^3_2HSiO_{0.5}$ units, $H_2SiO$ units and $R^3H_2SiO_{0.5}$ units. The raw materials for these units include chlorosilanes such as Me$_2$HSiCl, MeHSiCl$_2$, Ph$_2$HSiCl and PhHSiCl$_2$, and alkoxysilanes such as methoxysilanes that correspond with each of these chlorosilanes.

In the present invention, during production of the organohydrogenpolysiloxane of the component (B) by cohydrolysis and condensation of the raw materials described above, the $R^1SiO_{1.5}$ units, $R^2_2SiO$ units, $R^3_cH_dSiO_{(4-c-d)/2}$ units or combination of two or more of these units may include siloxane units that contain a silanol group. The organohydrogenpolysiloxane of the component (B) may typically comprise not more than 10 mol % (namely, from 0 to 10 mol %) of these silanol group-containing siloxane units relative to the combined total of all the siloxane units. Examples of the silanol group-containing siloxane units include (HO)SiO$_{1.5}$ units, $R^{2'}$(HO)SiO units, (HO)$_2$SiO units, H(HO)SiO units, H$_2$(HO)SiO$_{0.5}$ units, $R^3$H(HO)SiO$_{0.5}$ units, and H(HO)$_2$SiO$_{0.5}$ units (wherein $R^{2'}$ and $R^{3'}$ are as defined above for $R^2$ and $R^3$ respectively with the exception of excluding the hydroxyl group). The hydroxyl group mentioned in relation to $R^1$, $R^2$ and $R^3$ represents the hydroxyl group within these silanol group-containing siloxane units described above.

The blend amount of the organohydrogenpolysiloxane of the component (B) is sufficient that the molar ratio of hydrogen atoms bonded to silicon atoms (SiH groups) within the component (B) relative to the combined total of vinyl groups and allyl groups within the component (A) is typically within a range from 0.1 to 4.0, preferably from 0.5 to 3.0, and more preferably from 0.8 to 2.0. If this ratio is less than 0.1, then the curing reaction proceeds poorly, and achieving a silicone cured product becomes difficult, whereas if the ratio exceeds 4.0, then a large number of unreacted SiH groups remain within the cured product, which can cause changes in the properties of the cured product over time.

In the present invention, in order to ensure more favorable adhesion, either one or both of the component (A) and the component (B) preferably contain silanol groups. The amount of siloxane units that contain these silanol groups within the organopolysiloxane of the component (A) or the organohydrogenpolysiloxane of the component (B) is not more than 10 mol % (namely, from 0 to 10 mol %) relative to the combined total of all the siloxane units.

—(C) Platinum Group Metal-Based Catalyst—

This catalyst component is added to accelerate the addition curing reaction within the composition of the present invention, and is typically a platinum-based, palladium-based, or rhodium-based catalyst. Any of the conventional catalysts used for accelerating hydrosilylation reactions may be used as the catalyst. From the viewpoint of cost, platinum-based catalysts such as platinum, platinum black, chloroplatinic acid and platinum compounds such as $H_2PtCl_6 \cdot H_2O$, $K_2PtCl_6$, $KHPtCl_6 \cdot pH_2O$, $K_2PtCl_4$, $K_2PtCl_4 \cdot pH_2O$, $PtO_2 \cdot pH_2O$, $PtCl_4 \cdot pH_2O$, $PtCl_2$ and $H_2PtCl_4 \cdot pH_2O$ (wherein, p represents a positive integer), as well as complexes of these compounds with hydrocarbons such as olefins, alcohols, or vinyl group-containing organopolysiloxanes are preferred. These catalysts may be used either alone, or in combinations of two or more different catalysts.

The blend amount of the component (C) need only be sufficient to ensure effective curing, and a typical amount, calculated as a mass of the platinum group metal relative to the combined mass of the components (A) and (B), is within a range from 0.1 to 500 ppm. An amount of 0.5 to 100 ppm is preferred.

—(D) Filler—

The filler of component (D) is added to the composition of the present invention for the purposes of lowering the coefficient of linear expansion for the silicone laminated substrate of the present invention and increasing the strength of the substrate. Any conventional filler may be used as the component (D), and specific examples include silicas such as precipitated silica, fumed silica, fused silica, fused spherical silica and crystalline silica, fumed titanium dioxide, calcium carbonate, calcium silicate, titanium dioxide, ferric oxide, carbon black, zinc oxide, silicon nitride, aluminum nitride, boron nitride, antimony trioxide, alumina, zirconium oxide, zinc sulfide, magnesium oxide, and barium sulfate. Specific examples of reinforcing inorganic fillers include silicas such as precipitated silica and fumed silica, fumed titanium dioxide, alumina and aluminum nitride. Specific examples of non-reinforcing inorganic fillers include calcium carbonate, calcium silicate, titanium dioxide, ferric oxide, carbon black and zinc oxide. The component (D) may use either a single filler or a combination of two or more different fillers.

From the viewpoints of the coefficient of linear expansion and the strength of the resulting silicone laminated substrate, the blend amount of the component (D) is typically not more than 900 parts by mass (namely, 0 to 900 parts by mass), preferably not more than 600 parts by mass (namely, 0 to 600 parts by mass), more preferably within a range from 10 to 600 parts by mass, and still more preferably within a range from 50 to 500 parts by mass, per 100 parts by mass of the combination of components (A) and (B).

In those cases where the silicone laminated substrate of the present invention is a silicone laminated substrate used for an LED device, a filler comprising components (D1) and optionally (D2) described below is preferably used as the component (D).

(D1) Inorganic Filler

The component (D1) is an inorganic filler other than component (D2), and is added to the composition of the present invention for the purposes of lowering the coefficient of linear expansion for the silicone laminated substrate used for an LED device according to the present invention and increasing the mechanical strength of the substrate. Inorganic fillers typically added to silicone resin compositions can be used as the component (D1). Any conventional inorganic filler may be used as the component (D1), and specific examples include silicas such as fused silica, fused spherical silica and crystalline silica, silicon nitride, aluminum nitride, boron nitride and antimony trioxide. Fused silica and fused spherical silica are particularly preferable. The component (D1) may use either a single filler or a combination of two or more different fillers.

There are no particular restrictions on the average particle diameter and shape of the component (D1). The average particle diameter of the component (D1) is typically 0.5 to 50 μm and, from the viewpoints of the moldability and fluidity of the resulting silicone resin composition, is preferably 1 to 10

μm, and more preferably 1 to 5 μm. The average particle diameter can be determined as a mass average value $D_{50}$ (or a median diameter) in particle size distribution measurements conducted using a laser light diffraction method.

The surface of the inorganic filler of the component (D1) may be treated beforehand with a coupling agent such as a silane coupling agent and titanate coupling agent in order to increase the binding strength between the resin and the inorganic filler. Examples of preferably used coupling agents include epoxy-functional alkoxysilanes such as γ-glycidoxypropyltrimethoxysilane, γ-glycidoxypropylmethyldiethoxysilane and β-(3,4-epoxycyclohexyl)ethyltrimethoxysilane; amino-functional alkoxysilanes such as N-β(aminoethyl)γ-aminopropyltrimethoxysilane, γ-aminopropyltriethoxysilane and N-phenyl-γ-aminopropyltrimethoxysilane; and mercapto-functional alkoxysilanes such as γ-mercaptopropyltrimethoxysilane. There are no particular restrictions on the blend amount of the coupling agent used for surface treatment and the method of surface treatment.

The inorganic filler of the component (D1) may also be added to the composition of the present invention in the form of slurry in which the inorganic filler is dispersed in an organic solvent.

From the viewpoints of the coefficient of linear expansion and the strength of the resulting silicone laminated substrate used for an LED device, the blend amount of the component (D1) is preferably not more than 600 parts by mass (namely, 0 to 600 parts by mass), more preferably within a range from 10 to 600 parts by mass, and still more preferably within a range from 50 to 500 parts by mass, per 100 parts by mass of the combination of components (A) and (B).

(D2) White Pigment

The component (D2) is a white pigment, and is used as a white coloring agent for whitening a cured product obtained. When the resulting silicone laminated substrate used for an LED device is required to be capable of reflecting light, the component (D2) is added to the composition of the present invention for the purpose of increasing the light reflectance of the silicone laminated substrate. However, when a silicone laminated substrate that is not particularly required to be capable of reflecting light is to be obtained, the component (D2) is allowed not to be added to the composition of the present invention. As used herein, "the silicone laminated substrate is required to be capable of reflecting light" means that the silicone laminated substrate exhibits a light reflectance that is not less than 80% (namely, 80 to 100%), as described below. Any of the known white pigments used in conventional applications may be used as the component (D2) without any particular limitations, although the use of titanium dioxide, alumina, zirconium oxide, zinc sulfide, zinc oxide, magnesium oxide, barium sulfate, or a combination of two or more of these white pigments is preferred. Examples of such a combination include a combination of titanium dioxide and at least one of other white pigments specifically exemplified above. Of these, titanium dioxide, alumina, and magnesium oxide are more preferred, and titanium dioxide is still more preferred. Although the crystal form of titanium dioxide may be any of the rutile form, anatase form, and brookite form, the rutile form is preferably used.

The average particle diameter of the white pigment is preferably within a range from 0.05 to 10.0 μm, more preferably from 0.1 to 5.0 μm, and still more preferably from 0.1 to 1.0 μm. The surface of the white pigment of the component (D2) may be treated beforehand with a hydroxide such as a hydroxide of Al and hydroxide of Si in order to increase the mixability and dispersibility of the white pigment of the component (D2) with the resin components of the components (A) and (B) and the inorganic filler of the component (D1). As described above, the average particle diameter can be determined as a mass average value $D_{50}$ (or a median diameter) in particle size distribution measurements conducted using a laser light diffraction method. The component (D2) may use either a single white pigment or a combination of two or more different white pigments.

The blend amount of the component (D2) is preferably within a range from 1 to 300 parts by mass, more preferably from 3 to 200 parts by mass, and still more preferably from 10 to 150 parts by mass, per 100 parts by mass of the combination of components (A) and (B). If the blend amount is less than 1 part by mass, the whiteness of the resulting cured product may be inadequate. If the blend amount exceeds 300 parts by mass, the proportion of the inorganic filler of the component (D1) to the whole inorganic fillers may be too low, where the component (D1) is added for the purposes of lowering the coefficient of linear expansion for the silicone laminated substrate used for an LED device according to the present invention and increasing the mechanical strength of the substrate. The amount of the white pigment of the component (D2) is preferably within a range from 1 to 50% by mass, more preferably from 5 to 30% by mass, and still more preferably from 10 to 30% by mass, within the whole silicone resin composition.

—Other Components—

In addition to the components (A) through (D) described above, the composition of the present invention may also include various conventional additives as required.

Adhesion Assistants

In order to impart adhesiveness to the composition of the present invention, an adhesion assistant (adhesion-imparting agent) may be added as required. Either a single adhesion assistant or a combination of two or more different adhesion assistants may be used. Examples of these adhesion assistants include linear or cyclic organosiloxane oligomers of 4 to 50 silicon atoms, and preferably 4 to 20 silicon atoms, comprising at least two, and preferably either two or three, functional groups selected from the group consisting of a hydrogen atom bonded to a silicon atom (SiH group), an alkenyl group bonded to a silicon atom (such as a Si—CH=CH$_2$ group), an alkoxysilyl group (such as a trimethoxysilyl group) and an epoxy group (such as a glycidoxypropyl group or 3,4-epoxycyclohexylethyl group) within each molecule; organooxysilyl-modified isocyanurate compounds represented by a general formula (2) shown below; hydrolysis-condensation products thereof (organosiloxane-modified isocyanurate compounds); and combination of two or more of these compounds.

(2)

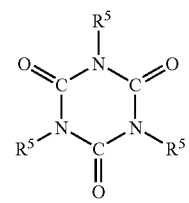

[wherein $R^5$ represents an organic group represented by a formula (3) shown below:

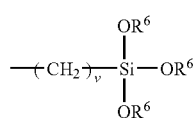

(wherein $R^6$ represents a hydrogen atom or a monovalent hydrocarbon group of 1 to 6 carbon atoms, and v represents an integer of 1 to 6, and preferably 1 to 4), or a monovalent hydrocarbon group comprising an aliphatic unsaturated bond, provided that at least one of the $R^5$ groups is an organic group of the formula (3).]

Examples of the monovalent hydrocarbon group comprising an aliphatic unsaturated bond represented by $R^5$ in the above general formula (2) include alkenyl groups of 2 to 8 carbon atoms, and preferably 2 to 6 carbon atoms, such as a vinyl group, allyl group, propenyl group, isopropenyl group, butenyl group, isobutenyl group, pentenyl group or hexenyl group, and cycloalkenyl groups of 6 to 8 carbon atoms such as a cyclohexenyl group. Furthermore, examples of the monovalent hydrocarbon group represented by $R^6$ in the formula (3) include monovalent hydrocarbon groups of 1 to 8 carbon atoms, and preferably 1 to 6 carbon atoms, including alkyl groups such as a methyl group, ethyl group, propyl group, isopropyl group, butyl group, isobutyl group, tert-butyl group, pentyl group or hexyl group, cycloalkyl groups such as a cyclohexyl group, the alkenyl groups and cycloalkenyl groups exemplified above for the $R^5$ group, and aryl groups such as a phenyl group. Of these, alkyl groups are preferred.

Specific examples of the adhesion assistant include 1,5-bis(glycidoxypropyl)-1,3,5,7-tetramethylcyclotetrasiloxane, 1-glycidoxypropyl-5-trimethoxysilylethyl-1,3,5,7-tetramethylcyclotetrasiloxane, and the compounds represented by the formulas shown below.

(wherein g and h each represents an integer within a range from 0 to 50, provided that g+h is from 2 to 50, and preferably from 4 to 20.)

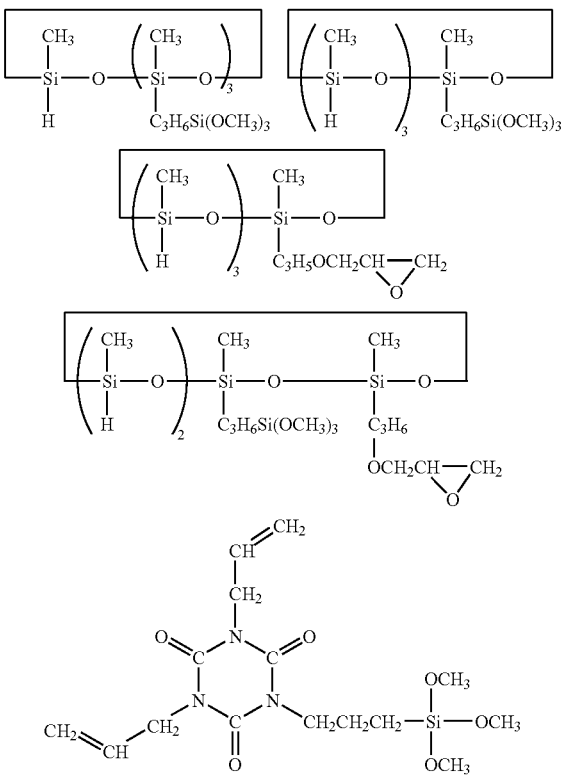

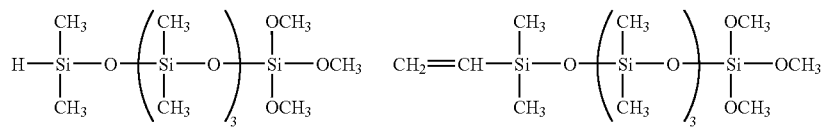

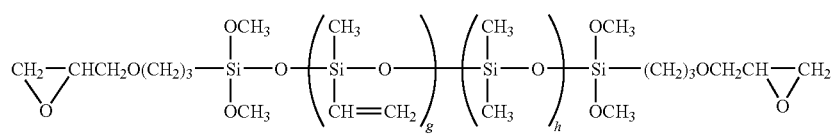

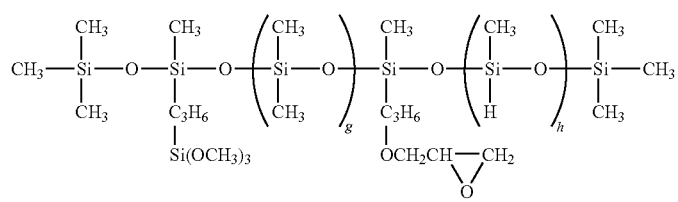

-continued

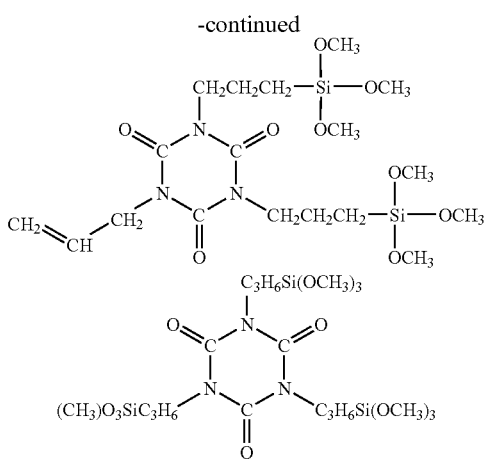

Of the organosilicon compounds described above, organosilicon compounds having a silicon atom-bonded alkoxy group and an alkenyl group or silicon atom-bonded hydrogen atom (SiH group) within each molecule are preferred as they impart the resulting cured product with particularly superior adhesion.

The blend amount of the adhesion assistant is typically not more than 10 parts by mass (namely, from 0 to 10 parts by mass), and is preferably from 0.1 to 8 parts by mass, and more preferably from 0.2 to 5 parts by mass, per 100 parts by mass of the component (A). A blend amount that is too large can have adverse effects on the hardness of the cured product, and may increase the surface tack.

Curing Retarder

If required, an appropriate amount of a curing retarder may also be added to the composition of the present invention. This curing retarder may use either a single retarder or a combination of two or more different retarders. Specific examples of the curing retarder include one or more compounds selected from the group consisting of organopolysiloxanes with a high vinyl group content such as tetramethyltetravinylcyclotetrasiloxane, triallyl isocyanurate, alkyl maleates, acetylene alcohols and silane-modified or siloxane-modified products thereof, hydroperoxides, tetramethylethylenediamine, benzotriazole, and mixtures of the above compounds. The curing retarder is typically added in a quantity within a range from 0.001 to 1.0 parts by mass, and preferably from 0.005 to 0.5 parts by mass, per 100 parts by mass of the component (A).

—Preparation—

The silicone resin composition of the present invention is prepared by mixing the required components uniformly together. Typically, the composition is stored as two separate liquids to prevent curing from proceeding, with the two liquids then mixed and cured at the time of use. The composition may, of course, also be prepared as a one-pot composition by adding a small amount of a curing retarder such as an aforementioned acetylene alcohol. Further, the silicone resin composition of the present invention may also be prepared by mixing the components (A) to (C) uniformly together to form a base composition, adding a solvent such as toluene, xylene or heptane to this base composition, and then adding the component (D), thus obtaining the silicone resin composition of the present invention in the form of a solution or dispersion. In those cases where the component (D) comprises the component (D1) and optionally the component (D2), the silicone resin composition may also be prepared by mixing the components (A) to (C) uniformly together to form a base composition, adding a solvent such as toluene, xylene or heptane to this base composition, and then adding the components (D1) and optionally (D2) to obtain the silicone resin composition in the form of a dispersion.

[Silicone Laminated Substrate]

A silicone laminated substrate of the present invention comprises:

a glass cloth, and a cured product of a silicone resin composition with which the glass cloth is filled and the surface of the glass cloth is coated. The thickness of the silicone laminated substrate may be selected appropriately in accordance with factors such as the intended application for the substrate and the thickness of the glass cloth used in producing the substrate, and although there are no particular restrictions, the substrate thickness is preferably within a range from 20 to 2,000 μM, and is more preferably from 50 to 1,000 μm.

The silicone laminated substrate of the present invention exhibits a coefficient of linear expansion in a direction perpendicular to the substrate (hereafter this direction is also referred to as the Z-axis direction), across a temperature range from −100 to 200° C., that is preferably not more than 50 ppm/° C. (namely, 0 to 50 ppm/° C.), and more preferably within a range from 5 to 40 ppm/° C. Furthermore, the silicone laminated substrate of the present invention exhibits a coefficient of linear expansion in a direction parallel to the substrate surface (hereafter this direction is also referred to as the XY-axis direction), across a temperature range from −100 to 200° C., that is preferably not more than 10 ppm/° C. (namely, 0 to 10 ppm/° C.), and more preferably within a range from 1 to 8 ppm/° C. The coefficient of linear expansion is measured using the thermomechanical analysis (TMA) method prescribed in JIS K 7197.

In one embodiment of the present invention, the silicone laminated substrate described above is a silicone laminated substrate used for an LED device, wherein the filler of component (D) comprises the component (D1) in an amount of not more than 600 parts by mass per 100 parts by mass of the combined total of components (A) and (B), and optionally the component (D2) in an amount within a range from 1 to 300 parts by mass per 100 parts by mass of the combined total of components (A) and (B). This silicone laminated substrate used for an LED device according to the present invention exhibits a light reflectance that is preferably not less than 80% (namely, 80 to 100%), and more preferably from 85 to 99%, across the entire visible light range. In the present invention, the light reflectance is measured, for example, using a device such as the light reflectance measuring device X-Rite 8200 (an integrating sphere spectrophotometer, manufactured by X-Rite (US), Inc.). In the present invention, the visible light range is defined as the range from 400 to 700 nm.

Furthermore, the silicone laminated substrate used for an LED device according to the present invention exhibits a light reflectance following an IR reflow treatment at a temperature of 260° C. for a period of 60 seconds that is preferably not less than 80% (namely, 80 to 100%), and more preferably from 85 to 98%, across the entire visible light range. In the present invention, the IR reflow treatment is conducted using an IR reflow apparatus.

Moreover, the silicone laminated substrate used for an LED device according to the present invention exhibits a light reflectance following irradiation for 24 hours at 120° C. with ultraviolet light having a wavelength of 365 nm and an intensity of 30 mW/cm$^2$ that is preferably not less than 80% (namely, 80 to 100%), and more preferably from 85 to 98%, across the entire visible light range.

—Glass Cloth—

There are no particular restrictions on the glass cloth, and conventional materials may be used. The glass cloth is in a sheet-like form, and although there are no particular restrictions on the thickness of the cloth, which may be selected appropriately in accordance with factors such as the intended application of the silicone laminated substrate, the thickness is, for example, within a range from 10 to 2,000 μm, preferably from 10 to 1,000 μm, and still more preferably from 20 to 300 μm. In the silicone laminated substrate used for an LED device according to the present invention, although there are no particular restrictions on the thickness of the glass cloth, which may be selected appropriately in accordance with factors such as the intended application of the silicone laminated substrate used for an LED device, the thickness is preferably within a range from 20 to 2,000 μm, and is more preferably from 50 to 1,000 μm.

—Cured Product of Silicone Resin Composition—

The cured product of a silicone resin composition with which the glass cloth is filled and the surface of the glass cloth is coated is a cured product of the silicone resin composition comprising the above components (A) to (D). In the silicone laminated substrate of the present invention, this cured product may coat either a single surface or both surfaces of the glass cloth, but preferably coats both surfaces of the glass cloth. There are no particular restrictions on the thickness of the cured product that coats the glass cloth surface, which may be selected in accordance with factors such as the intended application of the silicone laminated substrate of the present invention, but the thickness is preferably within a range from 20 to 2,000 μm, and is more preferably from 50 to 1,000 p.m. In the silicone laminated substrate used for an LED device according to the present invention, although there no particular restrictions on the thickness of the cured product that coats the glass cloth surface, which may be selected in accordance with factors such as the intended application of the silicone laminated substrate used for an LED device, the thickness is preferably within a range from 50 to 2,000 μm, and is more preferably from 60 to 1,000 μm.

—Method of Producing Silicone Laminated Substrate—

The silicone laminated substrate of the present invention can be obtained by:

impregnating a glass cloth with the silicone resin composition comprising the above components (A) to (D), wherein the silicone resin composition is dissolved or dispersed in a solvent, subsequently removing the solvent from the glass cloth by evaporation, and subsequently subjecting the silicone resin composition impregnated into the glass cloth to heat curing under compression molding conditions. The silicone laminated substrate used for an LED device according to the present invention can be obtained by using, as the component (D), a filler comprising the component (D1) in an amount of not more than 600 parts by mass per 100 parts by mass of the combined total of components (A) and (B), and optionally the component (D2) in an amount within a range from 1 to 300 parts by mass per 100 parts by mass of the combined total of components (A) and (B).

—Solvent—

There are no particular restrictions on the solvent, provided it is capable of dissolving or dispersing the silicone resin composition described above, and can then be evaporated at a temperature that enables the composition to be retained in an uncured or semi-cured state, and examples include solvents having a boiling point within a range from 50 to 200° C., and preferably from 80 to 150° C. When producing the silicone laminated substrate used for an LED device according to the present invention, there are no particular restrictions on the solvent, provided it is capable of dissolving or dispersing the silicone resin composition, and can then be evaporated at a temperature that enables the composition to be retained in an uncured or semi-cured state, and examples include solvents having a boiling point within a range from 50 to 150° C., and preferably from 60 to 100° C. Specific examples of the solvent include hydrocarbon-based non-polar solvents such as toluene, xylene, hexane and heptane, and ethers. There are no particular restrictions on the amount of solvent used, provided the amount is sufficient to enable the aforementioned silicone resin composition to be dissolved or dispersed satisfactorily, and the resulting solution or dispersion to then be satisfactorily impregnated into the glass cloth, although the amount of the solvent is preferably within a range from 10 to 200 parts by mass, and more preferably from 20 to 100 parts by mass, per 100 parts by mass of the silicone resin composition. When producing the silicone laminated substrate used for an LED device according to the present invention, there are no particular restrictions on the amount of solvent used, provided the amount is sufficient to enable the silicone resin composition to be dissolved or dispersed satisfactorily, and the resulting solution or dispersion to then be satisfactorily impregnated into the glass cloth, although the amount of the solvent is preferably within a range from 10 to 200 parts by mass, and more preferably from 50 to 100 parts by mass, per 100 parts by mass of the silicone resin composition.

The solution or dispersion of the silicone resin composition mentioned above can be impregnated into the glass cloth, for example, by immersing the glass cloth within the solution or dispersion, or by using a dipping apparatus to apply the solution or dispersion to one or both surfaces of the glass cloth.

Evaporation of the solvent can be conducted, for example, by allowing the glass cloth that has been impregnated with the silicone resin composition dissolved or dispersed in the solvent to stand in an atmosphere at a temperature of 50 to 150° C., and preferably 60 to 100° C. A heating apparatus such as an oven or dryer may be used as required.

The heat curing of the composition under compression molding conditions can be conducted, for example, using a hot press machine or vacuum press machine or the like, and is preferably conducted under a pressure within a range from 1 to 100 MPa, and more preferably from 5 to 50 MPa, at a temperature that is preferably within a range from 50 to 200° C., and more preferably from 70 to 180° C. The curing time is preferably within a range from 1 to 30 minutes, and is more preferably from 2 to 10 minutes. Further, post-curing may also be conducted, and is typically conducted at a temperature within a range from 50 to 200° C., and preferably from 70 to 180° C., for a period of 0.1 to 10 hours, and preferably 1 to 4 hours.

[LED Device]

An LED device of the present invention comprises the silicone laminated substrate used for an LED device according to the present invention, and an LED chip mounted on top of the substrate. FIG. 1 is a cross-sectional view illustrating one example of the LED device of the present invention. In the LED device 1 illustrated in FIG. 1, an electrode pattern 3 composed of an anode and a cathode is formed on the silicone laminated substrate 2 used for an LED device, and an LED chip 5 is die-bonded to one of the electrodes of the electrode pattern 3 via a die-bonding paste 4. The LED chip 5 and the other electrode of the electrode pattern 3 are connected with a bonding wire 6. A portion of the electrode pattern 3, the LED chip 5 and the bonding wire 6 are encapsulated using a transparent encapsulating material 7.

The electrode pattern 3 may be formed using a conventional method, for example by etching a copper clad laminate substrate comprising the silicone laminated substrate used for an LED device according to the present invention, and a copper foil provided on one or both surfaces of the substrate. Silver paste or the like may be used as the die-bonding paste 4. Gold wire or the like may be used as the bonding wire 6. The transparent encapsulating material 7 can be provided, for example, by molding a conventional encapsulating agent such as a silicone encapsulating agent or epoxy encapsulating agent into the desired shape and then performing curing.

EXAMPLES

A more detailed description of the present invention is provided below based on a series of synthesis examples, examples and comparative examples, although the present invention is in no way limited by the examples presented below. Weight average molecular weight values reported in the following examples refer to values measured by gel permeation chromatography (GPC) and referenced against polystyrene standards.

Synthesis Example 1

Vinyl Group-Containing Organopolysiloxane Resin (A1)

1142.1 g (87.1 mol %) of an organosilane represented by $PhSiCl_3$, 529 g (3.2 mol %) of $ClMe_2SiO(Me_2SiO)_{33}SiMe_2Cl$, and 84.6 g (9.7 mol %) of $MeViSiCl_2$ were dissolved in toluene solvent, and the resulting solution was added dropwise to water to effect a cohydrolysis. The product was washed with water, neutralized by alkali washing and dewatered, and the solvent was then stripped, completing synthesis of a vinyl group-containing resin (A1). This resin was a solid with a weight average molecular weight of 62,000 and a melting point of 60° C. The vinyl group content of the resin was 0.05 mol/100 g.

Synthesis Example 2

Hydrosilyl Group-Containing Organopolysiloxane Resin (B1)

1142.1 g (87.1 mol %) of the organosilane represented by $PhSiCl_3$, 529 g (3.2 mol %) of $ClMe_2SiO(Me_2SiO)_{33}SiMe_2Cl$, and 69 g (9.7 mol %) of $MeHSiCl_2$ were dissolved in toluene solvent, and the resulting solution was added dropwise to water to effect a cohydrolysis. The product was washed with water, neutralized by alkali washing and dewatered, and the solvent was then stripped, completing synthesis of a hydrosilyl group-containing resin (B1). This resin was a solid with a weight average molecular weight of 58,000 and a melting point of 58° C. The hydrosilyl group content of the resin was 0.05 mol/100 g.

Synthesis Example 3

Vinyl Group-Containing Organopolysiloxane Resin (A2)

1142.1 g (87.1 mol %) of an organosilane represented by $PhSiCl_3$, 529 g (3.2 mol %) of $ClMe_2SiO(Me_2SiO)_{33}SiMe_2Cl$, and 72.3 g (9.7 mol %) of $Me_2ViSiCl$ were dissolved in toluene solvent, and the resulting solution was added dropwise to water to effect a cohydrolysis. The product was washed with water, neutralized by alkali washing and dewatered, and the solvent was then stripped, completing synthesis of a vinyl group-containing resin (A2). This resin was a solid with a weight average molecular weight of 63,000 and a melting point of 63° C. The vinyl group content of the resin was 0.05 mol/100 g.

Synthesis Example 4

Hydrosilyl Group-Containing Organopolysiloxane Resin (B2)

1142.1 g (87.1 mol %) of the organosilane represented by $PhSiCl_3$, 529 g (3.2 mol %) of $ClMe_2SiO(Me_2SiO)_{33}SiMe_2Cl$, and 56.7 g (9.7 mol %) of $Me_2HSiCl$ were dissolved in toluene solvent, and the resulting solution was added dropwise to water to effect a cohydrolysis. The product was washed with water, neutralized by alkali washing and dewatered, and the solvent was then stripped, completing synthesis of a hydrosilyl group-containing resin (B2). This resin was a solid with a weight average molecular weight of 57,000 and a melting point of 56° C. The hydrosilyl group content of the resin was 0.05 mol/100 g.

Example 1

A base composition was prepared by combining 189 g of the vinyl group-containing resin (A1) obtained in synthesis example 1, 189 g of the hydrosilyl group-containing resin (B1) obtained in synthesis example 2, 0.2 g of the acetylene alcohol-based compound ethynylcyclohexanol as a reaction retarder, and 0.1 g of a 1% by mass octyl alcohol solution of chloroplatinic acid, and then stirring the resulting mixture thoroughly in a planetary mixer heated to 60° C. To this base composition were added 400 g of toluene as a solvent and then 378 g of silica (product name: Admafine E5/24C, average particle diameter: approximately 3 μm, manufactured by Admatechs Company Limited), thus completing preparation of a toluene dispersion of a silicone resin composition.

A glass cloth (thickness: 100 μm, manufactured by Nitto Boseki Co., Ltd.) was immersed in the toluene dispersion, thereby impregnating the glass cloth with the toluene dispersion. The glass cloth was then removed from the dispersion and left to stand for 2 hours at 60° C. to allow the toluene to evaporate. Evaporation of the toluene resulted in the formation of a coating film that was solid at room temperature on both surfaces of the glass cloth. A molded item was prepared by subjecting the glass cloth to compression molding at 150° C. for 10 minutes in a hot press machine, and this molded item was then subjected to secondary curing at 150° C. for one hour, thus yielding a silicone laminated substrate.

1. External Appearance

The uniformity of the surface of the obtained silicone laminated substrate, namely a determination as to whether the surface was smooth, or was uneven and lacked uniformity, was ascertained by visual inspection.

2. Mechanical Properties

The prepared silicone laminated substrate was measured for tensile strength (thickness: 0.2 mm) and hardness (measured using a D type spring tester, thickness: 6 mm (namely, 0.2 mm×30 layers)) in accordance with the methods prescribed in JIS K 6251 and JIS K 6253.

3. Surface Tack

The tack of the surface of the obtained silicone laminated substrate was ascertained by finger touch.

4. Coefficient of Linear Expansion

The coefficient of linear expansion of the obtained silicone laminated substrate (thickness: 0.2 mm) was measured in a direction perpendicular to the substrate (the Z-axis direction) and a direction parallel to the substrate (the XY-axis direction), across a temperature range from −100 to 200° C., using the thermomechanical analysis (TMA) method prescribed in JIS K 7197.

5. IR Reflow Test

Using the same method as that described above, an aforementioned glass cloth was impregnated with the toluene dispersion described above, and the toluene was then evaporated. Following evaporation of the toluene, the glass cloth was sandwiched between two sheets of copper foil (thickness: 38 μm, manufactured by Fukuda Metal Foil & Powder Co., Ltd.) and then subjected to compression molding at 150° C. for 10 minutes in a hot press machine, thus forming a molded item. This molded item was then subjected to secondary curing at 150° C. for one hour, yielding a copper clad laminate substrate (thickness: 0.3 mm). This copper clad laminate substrate was subjected to an IR reflow treatment at 260° C. for 10 minutes using an IR reflow apparatus (product name: Reflow Soldering System, manufactured by Tamura Corporation), and the copper foil was inspected for evidence of peeling.

The results of each of the above measurements are shown in Table 1.

Example 2

In example 1, with the exception of replacing the vinyl group-containing resin (A1) obtained in synthesis example 1 and the hydrosilyl group-containing resin (B1) obtained in synthesis example 2 with the vinyl group-containing resin (A2) obtained in synthesis example 3 and the hydrosilyl group-containing resin (B2) obtained in synthesis example 4 respectively, a silicone laminated substrate and a copper clad laminate substrate were prepared and evaluated in the same manner as example 1. The results of the evaluations are shown in Table 1. Evaporation of the toluene resulted in the formation of a coating film that was solid at room temperature on both surfaces of the glass cloth.

Example 3

In example 1, with the exception of also adding 6 g of an adhesion assistant represented by a formula shown below during preparation of the base composition, a silicone laminated substrate and a copper clad laminate substrate were prepared and evaluated in the same manner as example 1. The results of the evaluations are shown in Table 1. Evaporation of the toluene resulted in the formation of a coating film that was solid at room temperature on both surfaces of the glass cloth.

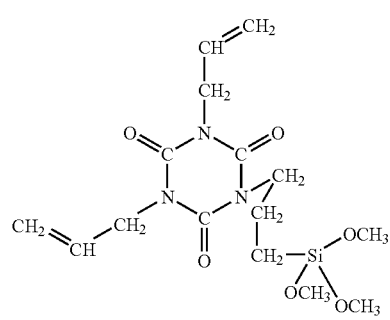 [SMILES: C=CCn1c(=O)n(CC=C)c(=O)n(CCC[Si](OC)(OC)OC)c1=O]

Comparative Example 1

With the exception of replacing the base composition from example 1 with 189 g of a commercially available addition reaction-curable silicone varnish KJR-632 (a product name, manufactured by Shin-Etsu Chemical Co., Ltd.) that contains a vinyl group-containing organopolysiloxane resin having no linear diorganopolysiloxane continuous chain structure with a number of repeating units of 5 to 50 as the main component, a silicone laminated substrate and a copper clad laminate substrate were prepared and evaluated in the same manner as example 1. The results of the evaluations are shown in Table 1. The dispersibility of the silica within the silicone varnish was poor, and as listed in Table 1, a silicone laminated substrate with a uniform surface was unobtainable.

TABLE 1

|  | Example 1 | Example 2 | Example 3 | Comparative example 1 |
|---|---|---|---|---|
| SiH/SiVi (*1) | 1.0 | 1.0 | 1.0 | 1.0 |
| Secondary curing conditions | 150° C./1 hr | 150° C./1 hr | 150° C./1 hr | 150° C./1 hr |
| External appearance | Smooth | Smooth | Smooth | Non-uniform |
| Hardness (type D) | 70 | 70 | 70 | 80 |
| Tensile strength (N/mm$^2$) | 1,000 | 1,000 | 1,200 | 800 |
| Tack | No | No | No | No |
| Coefficient of linear expansion (ppm/° C.) (Z-axis direction) | 17 | 17 | 17 | 15 |
| Coefficient of linear expansion (ppm/° C.) (XY-axis direction) | 10 | 10 | 10 | 10 |
| IR reflow test | No anomalies (no peeling) | No anomalies (no peeling) | No anomalies (no peeling) | Peeling |

(Note)

(*1): The molar ratio of silicon atom-bonded hydrogen atoms within the hydrosilyl group-containing resin relative to silicon atom-bonded vinyl groups within the vinyl group-containing resin.

Example 4

A base composition was prepared by combining 189 g of the vinyl group-containing resin (A1) obtained in synthesis example 1, 189 g of the hydrosilyl group-containing resin (B1) obtained in synthesis example 2, 0.2 g of the acetylene alcohol-based compound ethynylcyclohexanol as a reaction retarder, 0.1 g of a 1% by mass octyl alcohol solution of chloroplatinic acid, and 6 g of an adhesion assistant represented by a formula shown below, and then stirring the resulting mixture thoroughly in a planetary mixer heated to 60° C. To this base composition were added 400 g of toluene as a solvent, and then 378 g of silica (product name: Admafine E5/24C, average particle diameter: approximately 3 μm, manufactured by Admatechs Company Limited) and 38 g of titanium oxide (product name: PF-691, average particle diameter: approximately 0.2 μm, manufactured by Ishihara Sangyo Kaisha, Ltd.), thus completing preparation of a toluene dispersion of a silicone resin composition.

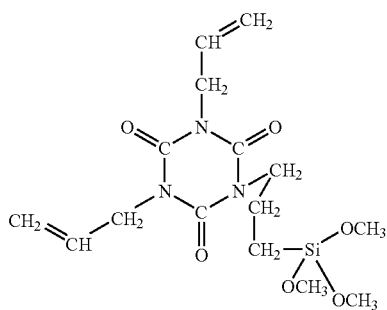 [SMILES: C=CCn1c(=O)n(CC=C)c(=O)n(CCC[Si](OC)(OC)OC)c1=O]

A glass cloth (thickness: 100 μm, manufactured by Nitto Boseki Co., Ltd.) was immersed in the toluene dispersion, thereby impregnating the glass cloth with the toluene dispersion. The glass cloth was then removed from the dispersion and left to stand for 2 hours at 60° C. to allow the toluene to evaporate. Evaporation of the toluene resulted in the formation of a coating film that was solid at room temperature on both surfaces of the glass cloth. A molded item was prepared by subjecting the glass cloth to compression molding at 150° C. for 10 minutes in a hot press machine, and this molded item was then subjected to secondary curing at 150° C. for one hour, thus yielding a silicone laminated substrate.

Evaluation of the external appearance, measurement of the mechanical properties, determination of the surface tack, measurement of the coefficient of linear expansion, and IR reflow testing were all conducted in the same manner as example 1.

6. Light Reflectance

The prepared silicone laminated substrate was measured for light reflectance across the entire visible light range. Further, the prepared silicone laminated substrate was also subjected to an IR reflow treatment at 260° C. for 60 seconds using an IR reflow apparatus, and the light reflectance across the entire visible light range was then re-measured. Moreover, the prepared silicone laminated substrate was also subjected to irradiation for 24 hours at 120° C. with ultraviolet light having a wavelength of 365 nm and an intensity of 30 mW/cm$^2$, and the light reflectance across the entire visible light range was then re-measured. The light reflectance was measured using a light reflectance measuring device X-Rite 8200 (an integrating sphere spectrophotometer, manufactured by X-Rite (US), Inc.).

The results of each of these measurements are shown in Table 2.

7. Lighting Test

An LED device of the type illustrated in FIG. 1 was prepared, and a lighting test was conducted. In FIG. 1, the electrode pattern 3 was fabricated by etching a copper clad laminate substrate prepared in the manner described above. Using KJR-632DA-1 (manufactured by Shin-Etsu Chemical Co., Ltd.) as the die bonding paste 4, a blue LED chip 5 (wavelength: 450 nm) was die-bonded to one electrode of the electrode pattern 3. Gold wire was used for the bonding wire 6. The transparent encapsulating material 7 was formed by casting (curing conditions: 150° C., 4 hours) a silicone resin coating agent (product name: KJR-9022, manufactured by Shin-Etsu Chemical Co., Ltd.) so that the silicone resin coating agent coated a portion of the electrode pattern 3, the LED chip 5, and the bonding wire 6. The lighting test was performed by operating the thus formed LED device under continuous lighting conditions using an electric current of 150 mA, and inspecting the silicone laminated substrate for discoloration. The results are shown in Table 3.

Example 5

In example 4, with the exception of replacing the vinyl group-containing resin (A1) obtained in synthesis example 1 and the hydrosilyl group-containing resin (B1) obtained in synthesis example 2 with the vinyl group-containing resin (A2) obtained in synthesis example 3 and the hydrosilyl group-containing resin (B2) obtained in synthesis example 4 respectively, a silicone laminated substrate and a copper clad laminate substrate were prepared and evaluated in the same manner as example 4. The results of the evaluations are shown in Tables 2 and 3. Evaporation of the toluene resulted in the formation of a coating film that was solid at room temperature on both surfaces of the glass cloth.

Comparative Example 2

With the exception of replacing the copper clad laminated substrate prepared in example 4 with a commercially available white glass epoxy substrate having copper foil on both surfaces, an LED device was fabricated and subjected to a lighting test in the same manner as example 4. The results of the test are shown in Table 3.

TABLE 2

|  | Example 4 | Example 5 |
|---|---|---|
| SiH/SiVi (*1) | 1.0 | 1.0 |
| Secondary curing conditions | 150° C./1 hr | 150° C./1 hr |
| External appearance | Smooth | Smooth |
| Hardness (type D) | 70 | 70 |
| Tensile strength (N/mm$^2$) | 100 | 100 |
| Tack | No | No |
| Coefficient of linear expansion (ppm/° C.) (Z-axis direction) | 10 | 10 |

TABLE 2-continued

|  | Example 4 | Example 5 |
|---|---|---|
| Coefficient of linear expansion (ppm/° C.) (XY-axis direction) | 3 | 3 |
| IR reflow test | No anomalies (no peeling) | No anomalies (no peeling) |
| Light reflectance | Not less than 90% across the entire visible light range | Not less than 90% across the entire visible light range |
| Light reflectance (after IR reflow treatment) | Not less than 90% across the entire visible light range | Not less than 90% across the entire visible light range |
| Light reflectance (after ultraviolet light irradiation) | Not less than 90% across the entire visible light range | Not less than 90% across the entire visible light range |

(Note)
(*1): The molar ratio of silicon atom-bonded hydrogen atoms within the hydrosilyl group-containing resin relative to silicon atom-bonded vinyl groups within the vinyl group-containing resin.

TABLE 3

| Continuous lighting time | Example 4 | Example 5 | Comparative example 2 |
|---|---|---|---|
| 1,000 hours | No discoloration | No discoloration | No discoloration |
| 2,000 hours | No discoloration | No discoloration | Yellow discoloration |
| 3,000 hours | No discoloration | No discoloration | Brown discoloration |

What is claimed is:

1. A silicone laminated substrate, comprising:
a glass cloth, and
a cured product of a silicone resin composition with which the glass cloth is filled and a surface of the glass cloth is coated,
wherein the silicone resin composition is a solid or semisolid at room temperature and comprises:
(A) an organopolysiloxane having a resin structure, consisting of $R^1SiO_{1.5}$ units, $R^2_2SiO$ units and $R^3_aR^4_bSiO_{(4-a-b)/2}$ units, wherein, $R^1$, $R^2$ and $R^3$ each independently represents a hydroxyl group, methyl group, ethyl group, propyl group, cyclohexyl group or phenyl group, each $R^4$ independently represents a vinyl group or allyl group, a represents 0, 1 or 2, and b represents 1 or 2, provided that a+b is 2 or 3, and including a structure in which at least a portion of the $R^2_2SiO$ units are connected in a continuous repeating sequence, and a number of units in the repeating sequence is within a range from 5 to 50,
(B) an organohydrogenpolysiloxane having a resin structure, consisting of $R^1SiO_{1.5}$ units, $R^2_2SiO$ units and $R^3_cH_dSiO_{(4-c-d)/2}$ units, wherein, $R^1$, $R^2$ and $R^3$ are each independently as defined above, c represents 0, 1 or 2, and d represents 1 or 2, provided that c+d is 2 or 3, and including a structure in which at least a portion of the $R^2_2SiO$ units are connected in a continuous repeating sequence, and a number of units in the repeating sequence is within a range from 5 to 50: in sufficient amount that a molar ratio of hydrogen atoms bonded to silicon atoms within component (B) relative to a combined total of vinyl groups and allyl groups within component (A) is within a range from 0.1 to 4.0,
(C) a platinum group metal-based catalyst: in an effective amount, and
(D) a filler in an amount of not more than 900 parts by mass per 100 parts by mass of a combined total of components (A) and (B), wherein said filler component (D) comprises
  (D1) a silica in an amount of from 10 to 600 parts by mass per 100 parts by mass of a combined total of components (A) and (B) and
  (D2) a white pigment selected from titanium dioxide and alumina in an amount within a range from 1 to 300 parts by mass per 100 parts by mass of a combined total of components (A) and (B),
wherein light reflectance of the silicone-laminated substrate is not less than 80% across an entire visible light range.

2. The silicone laminated substrate according to claim 1, wherein either one or both of component (A) and component (B) comprises a silanol group.

3. The silicone laminated substrate according to claim 1, wherein a coefficient of linear expansion in a direction perpendicular to the silicone laminated substrate is not more than 50 ppm/° C. across a temperature range from −100 to 200° C.

4. The silicone laminated substrate according to claim 1, wherein a coefficient of linear expansion in a direction parallel to the silicone laminated substrate is not more than 10 ppm/° C. across a temperature range from −100 to 200° C.

5. The silicone laminated substrate according to claim 1, which is configured for use as an LED device.

6. The silicone laminated substrate according to claim 5, wherein either one or both of component (A) and component (B) comprises a silanol group.

7. The silicone laminated substrate according to claim 5, wherein a coefficient of linear expansion in a direction perpendicular to the silicone laminated substrate is not more than 50 ppm/° C. across a temperature range from −100 to 200° C.

8. The silicone laminated substrate according to claim 5, wherein a coefficient of linear expansion in a direction parallel to the silicone laminated substrate is not more than 10 ppm/° C. across a temperature range from −100 to 200° C.

9. The silicone laminated substrate according to claim 5, wherein light reflectance following an IR reflow treatment at a temperature of 260° C. for 60 seconds is not less than 80% across an entire visible light range.

10. The silicone laminated substrate according to claim 5, wherein light reflectance following irradiation with ultraviolet light having a wavelength of 365 nm and an intensity of 30 mW/cm$^2$ for 24 hours at 120° C. is not less than 80% across an entire visible light range.

11. A method of producing a silicone laminated substrate, wherein light reflectance of the silicone laminated substrate is not less than 80% across an entire visible light range, the method comprising:
impregnating a glass cloth with a silicone resin composition that is a solid or semisolid at room temperature and is dissolved or dispersed in a solvent,
subsequently removing the solvent from the glass cloth by evaporation, and subsequently subjecting the silicone resin composition impregnated into the glass cloth to heat curing under compression molding conditions, wherein the silicone laminated substrate comprises:

a glass cloth, and a cured product of the silicone resin composition with which the glass cloth is filled and a surface of the glass cloth is coated, and the silicone resin composition comprises:

(A) an organopolysiloxane having a resin structure, consisting of $R^1SiO_{1.5}$ units, $R^2_2SiO$ units and $R^3_aR^4_bSiO_{(4-a-b)/2}$ units, wherein, $R^1$, $R^2$ and $R^3$ each independently represents a hydroxyl group, methyl group, ethyl group, propyl group, cyclohexyl group or phenyl group, each $R^4$ independently represents a vinyl group or allyl group, a represents 0, 1 or 2, and b represents 1 or 2, provided that a+b is 2 or 3, and including a structure in which at least a portion of the $R^2_2SiO$ units are connected in a continuous repeating sequence, and a number of units in the repeating sequence is within a range from 5 to 50, (B) an organohydrogenpolysiloxane having a resin structure, consisting of $R^1SiO_{1.5}$ units, $R^2_2SiO$ units and $R^3_cH_dSiO_{(4-c-d)/2}$ units, wherein, $R^1$, $R^2$ and $R^3$ are each independently as defined above, c represents 0, 1 or 2, and d represents 1 or 2, provided that c+d is 2 or 3, and including a structure in which at least a portion of the $R^2_2SiO$ units are connected in a continuous repeating sequence, and a number of units in the repeating sequence is within a range from 5 to 50:

in sufficient amount that a molar ratio of hydrogen atoms bonded to silicon atoms within component (B) relative to a combined total of vinyl groups and allyl groups within component (A) is within a range from 0.1 to 4.0, (C) a platinum group metal-based catalyst: in an effective amount, and (D) a filler: in an amount of not more than 900 parts by mass per 100 parts by mass of a combined total of components (A) and (B), wherein said filler of component (D) comprises:

(D1) a silica in an amount of from 10 to 600 parts by mass per 100 parts by mass of a combined total of components (A) and (B); and (D2) a white pigment selected from titanium dioxide and alumina in an amount within a range from 1 to 300 parts by mass per 100 parts by mass of a combined total of components (A) and (B).

12. A silicone resin composition for producing a silicone laminated substrate, the composition comprising wherein the silicone resin composition is a solid or semisolid at room temperature and comprises:

(A) an organopolysiloxane having a resin structure, consisting of $R^1SiO_{1.5}$ units, $R^2_2SiO$ units and $R^3_aR^4_bSiO_{(4-a-b)/2}$ units, wherein, $R^1$, $R^2$ and $R^3$ each independently represents a hydroxyl group, methyl group, ethyl group, propyl group, cyclohexyl group or phenyl group, each $R^4$ independently represents a vinyl group or allyl group, a represents 0, 1 or 2, and b represents 1 or 2, provided that a+b is 2 or 3, and including a structure in which at least a portion of the $R^2_2SiO$ units are connected in a continuous repeating sequence, and a number of units in the repeating sequence is within a range from 5 to 50, (B) an organohydrogenpolysiloxane having a resin structure, consisting of $R^1SiO_{1.5}$ units, $R^2_2SiO$ units and $R^3_cH_dSiO_{(4-c-d)/2}$ units, wherein, $R^1$, $R^2$ and $R^3$ are each independently as defined above, c represents 0, 1 or 2, and d represents 1 or 2, provided that c+d is 2 or 3, and including a structure in which at least a portion of the $R^2_2SiO$ units are connected in a continuous repeating sequence, and a number of units in the repeating sequence is within a range from 5 to 50: in sufficient amount that a molar ratio of hydrogen atoms bonded to silicon atoms within component (B) relative to a combined total of vinyl groups and allyl groups within component (A) is within a range from 0.1 to 4.0, (C) a platinum group metal-based catalyst: in an effective amount, and (D) a filler: in an amount of not more than 900 parts by mass per 100 parts by mass of a combined total of components (A) and (B), wherein said filler component (D) comprises (D1) a silica in an amount of from 10 to 600 parts by mass per 100 parts by mass of a combined total of components (A) and (B) and (D2) a white pigment selected from titanium dioxide and alumina in an amount within a range from 1 to 300 parts by mass per 100 parts by mass of a combined total of components (A) and (B), wherein light reflectance of the silicone-laminated substrate is not less than 80% across an entire visible light range.

13. An LED device, comprising:

a silicone laminated substrate, and an LED chip mounted on top of the substrate, wherein the silicone laminated substrate is used for an LED device and comprises:

a glass cloth, and a cured product of a silicone resin composition with which the glass cloth is filled and a surface of the glass cloth is coated;

the silicone resin composition is a solid or semisolid at room temperature and comprises:

(A) an organopolysiloxane having a resin structure, consisting of $R^1SiO_{1.5}$ units, $R^2_2SiO$ units and $R^3_aR^4_bSiO_{(4-a-b)/2}$ units, wherein, $R^1$, $R^2$ and $R^3$ each independently represents a hydroxyl group, methyl group, ethyl group, propyl group, cyclohexyl group or phenyl group, each $R^4$ independently represents a vinyl group or allyl group, a represents 0, 1 or 2, and b represents 1 or 2, provided that a+b is 2 or 3, and including a structure in which at least a portion of the $R^2_2SiO$ units are connected in a continuous repeating sequence, and a number of units in the repeating sequence is within a range from 5 to 50, (B) an organohydrogenpolysiloxane having a resin structure, consisting of $R^1SiO_{1.5}$ units, $R^2_2SiO$ units and $R^3_cH_dSiO_{(4-c-d)/2}$ units, wherein, $R^1$, $R^2$ and $R^3$ are each independently as defined above, c represents 0, 1 or 2, and d represents 1 or 2, provided that c+d is 2 or 3, and including a structure in which at least a portion of the $R^2_2SiO$ units are connected in a continuous repeating sequence, and a number of units in the repeating sequence is within a range from 5 to 50:

in sufficient amount that a molar ratio of hydrogen atoms bonded to silicon atoms within component (B) relative to a combined total of vinyl groups and allyl groups within component (A) is within a range from 0.1 to 4.0, (C) a platinum group metal-based catalyst: in an effective amount, and (D) a filler: in an amount of not more than 900 parts by mass per 100 parts by mass of a combined total of components (A) and (B); and the filler of component (D) comprises:

(D1) a silica in an amount of from 10 to 600 parts by mass per 100 parts by mass of a combined total of components (A) and (B) and (D2) a white pigment selected from titanium dioxide and alumina in an amount within a range from 1 to 300 parts by mass per 100 parts by mass of a combined total of components (A) and (B), wherein light reflectance of the silicone laminated substrate is not less than 80% across an entire visible light range.

14. The LED device according to claim 13, wherein component (D2) is titanium dioxide.

15. The silicone-laminated substrate according to claim 1, wherein component (D2) is titanium dioxide.

16. The silicone composition according to claim 12, wherein the silicone-laminated substrate is configured for use as an LED device.

17. The silicone composition according to claim 16, wherein component (D2) is titanium dioxide.

18. The silicone laminated substrate according to claim 1, wherein (D1) the silica is contained in an amount of from 50 to 500 parts by mass per 100 parts by mass of a combined total of components (A) and (B), and (D2) the white pigment is contained in an amount of from 3 to 200 parts by mass per 100 parts by mass of a combined total of components (A) and (B).

19. The silicone resin composition according to claim 12, wherein (D1) the silica is contained in an amount of from 50 to 500 parts by mass per 100 parts by mass of a combined total of components (A) and (B), and (D2) the white pigment is contained in an amount of from 3 to 200 parts by mass per 100 parts by mass of a combined total of components (A) and (B).

20. The LED device according to claim 13, wherein (D1) the silica is contained in an amount of from 50 to 500 parts by mass per 100 parts by mass of a combined total of components (A) and (B), and (D2) the white pigment is contained in an amount of from 3 to 200 parts by mass per 100 parts by mass of a combined total of components (A) and (B).

* * * * *